(12) United States Patent
Chin (10) Patent No.: US 9,679,185 B2
(45) Date of Patent: *Jun. 13, 2017

(54) BIOMETRIC IDENTIFICATION DEVICE HAVING SENSING ELECTRODES WITH MULTIPLE CONNECTION SELECTIONS

(71) Applicant: SuperC-Touch Corporation, New Taipei (TW)

(72) Inventor: Shang Chin, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 65 days.

This patent is subject to a terminal disclaimer.

(21) Appl. No.: 14/819,156

(22) Filed: Aug. 5, 2015

(65) Prior Publication Data

US 2016/0042218 A1 Feb. 11, 2016

(30) Foreign Application Priority Data

Aug. 6, 2014 (TW) .............................. 103213948 U (51) Int. Cl.
*G06K 9/00* (2006.01)
*G06F 3/044* (2006.01)
*G06F 3/041* (2006.01)
*H01L 27/12* (2006.01)

(52) U.S. Cl.
CPC ........... *G06K 9/0002* (2013.01); *G06F 3/044* (2013.01); *G06F 3/0418* (2013.01); *H01L 27/124* (2013.01); *H01L 27/1218* (2013.01); *H01L 27/1255* (2013.01)

(58) Field of Classification Search
CPC ..... G06K 9/0002; G06F 3/044; G06F 3/0418; H01L 27/1218; H01L 27/124; H01L 27/1255

See application file for complete search history.

(56) References Cited

U.S. PATENT DOCUMENTS

| 5,940,526 A * | 8/1999 | Setlak ................. G06K 9/0002 382/124 |
| 6,060,756 A * | 5/2000 | Machida ................ G01B 7/004 257/414 |
| 2002/0000915 A1* | 1/2002 | Lee ..................... G06K 9/0002 340/540 |

(Continued)

*Primary Examiner* — Aaron W Carter
(74) *Attorney, Agent, or Firm* — Muncy, Geissler, Olds & Lowe, P.C.

(57) ABSTRACT

A biometric identification device having sensing electrodes with multiple connection selections includes a plurality of sensing electrodes disposed on a surface of a substrate, each sensing electrode corresponding to a data readout selector and at least one reference voltage selector. The data readout selector has a first terminal connected to the sensing electrode and a second terminal connected to a corresponding data readout select trace. The reference voltage selector has a first terminal connected to the first terminal of the data readout selector and a second terminal connected to a corresponding reference voltage select trace. A control unit divides the sensing electrodes into at least one sensing area and at least one non-sensing area by means of the data readout selectors, the data readout select traces, the reference voltage selectors, and the reference voltage select traces.

9 Claims, 8 Drawing Sheets (56) References Cited

U.S. PATENT DOCUMENTS

| | | | |
|---|---|---|---|
| 2003/0190061 A1* | 10/2003 | Chou | G06K 9/0002 |
| | | | 382/124 |
| 2004/0241887 A1* | 12/2004 | Fujii | G01R 31/312 |
| | | | 438/14 |
| 2007/0133302 A1* | 6/2007 | Oda | G11C 16/3418 |
| | | | 365/185.23 |
| 2011/0063233 A1* | 3/2011 | Chuang | G06F 3/0416 |
| | | | 345/173 |
| 2011/0316809 A1* | 12/2011 | Kim | G06F 3/0412 |
| | | | 345/174 |
| 2012/0056663 A1* | 3/2012 | Oh | G06F 3/0412 |
| | | | 327/517 |
| 2013/0287274 A1* | 10/2013 | Shi | G06F 3/044 |
| | | | 382/124 |
| 2014/0111450 A1* | 4/2014 | Lee | G06F 3/044 |
| | | | 345/173 |
| 2016/0034739 A1* | 2/2016 | Chin | G06K 9/00053 |
| | | | 382/124 |
| 2016/0042218 A1* | 2/2016 | Chin | G06K 9/0002 |
| | | | 382/124 |
| 2016/0055363 A1* | 2/2016 | Lee | G06K 9/0002 |
| | | | 382/124 |
| 2016/0098140 A1* | 4/2016 | Lee | G06F 3/0416 |
| | | | 345/173 |
| 2016/0132177 A1* | 5/2016 | Bae | G06K 9/00013 |
| | | | 345/174 |
| 2016/0132713 A1* | 5/2016 | Bae | G06F 3/0412 |
| | | | 345/174 |
| 2016/0148036 A1* | 5/2016 | Kim | G06K 9/0002 |
| | | | 382/124 |
| 2016/0239700 A1* | 8/2016 | Yang | G06K 9/0002 |
| 2016/0309104 A1* | 10/2016 | Peng | H04N 5/32 |
| 2016/0314332 A1* | 10/2016 | Lee | G06K 9/0002 |
| 2016/0350577 A1* | 12/2016 | Yang | G06K 9/00053 |

* cited by examiner

BIOMETRIC IDENTIFICATION DEVICE HAVING SENSING ELECTRODES WITH MULTIPLE CONNECTION SELECTIONS

BACKGROUND OF THE INVENTION

1. Field of the Invention

The present invention relates to a structure of a biometric identification device and, more particularly, to a biometric identification device having sensing electrodes with multiple connection selections.

2. Description of Related Art

Biological feature sensing and comparing technologies have been maturely and widely applied in identifying and verifying the identity of a person. Typical biometric identification types include fingerprint, voiceprint, iris, retina identification, and the like. For consideration of safe, comfortable, and efficient identification, the fingerprint identification has become the most popular one. The fingerprint identification generally requires a scanning to input a fingerprint or a finger image of a user and store the unique features of the finger image and/or the fingerprint for being further compared with the fingerprint reference built in a database so as to identify or verify the identity of a person.

The image input types of the fingerprint identification include optical scanning, thermal image sensing, capacitive sensing, and the like. The optical scanning type is difficult to be applied in mobile electronic devices due to its large volume, and the thermal image sensing type is not popular due to its poor accuracy and reliability. Thus, the capacitive sensing type gradually becomes the most important biometric identification technology for the mobile electronic device.

In prior capacitive image sensing technology, the sensing electrodes and the detecting circuit are typically implemented on a single integrated circuit (IC) to increase the signal to noise ratio (SNR) and signal detection quality. The capacitive image sensing can be divided into two types, including a linear swiping scan and a full area detection. The positioning recovery of the former one is difficult, which may cause the image distortion and poor image quality. The latter one requires an IC manufacturing process to make sensing electrodes, which results in a large wafer area to be used and a relatively high cost. In addition, both of them have the drawbacks of complication and difficulty in packaging, poor mechanical strength, fragility, susceptible to moisture erosion damage, and the like, and thus the reliability and the usage lifetime of the device are not users satisfied.

Figure 1:
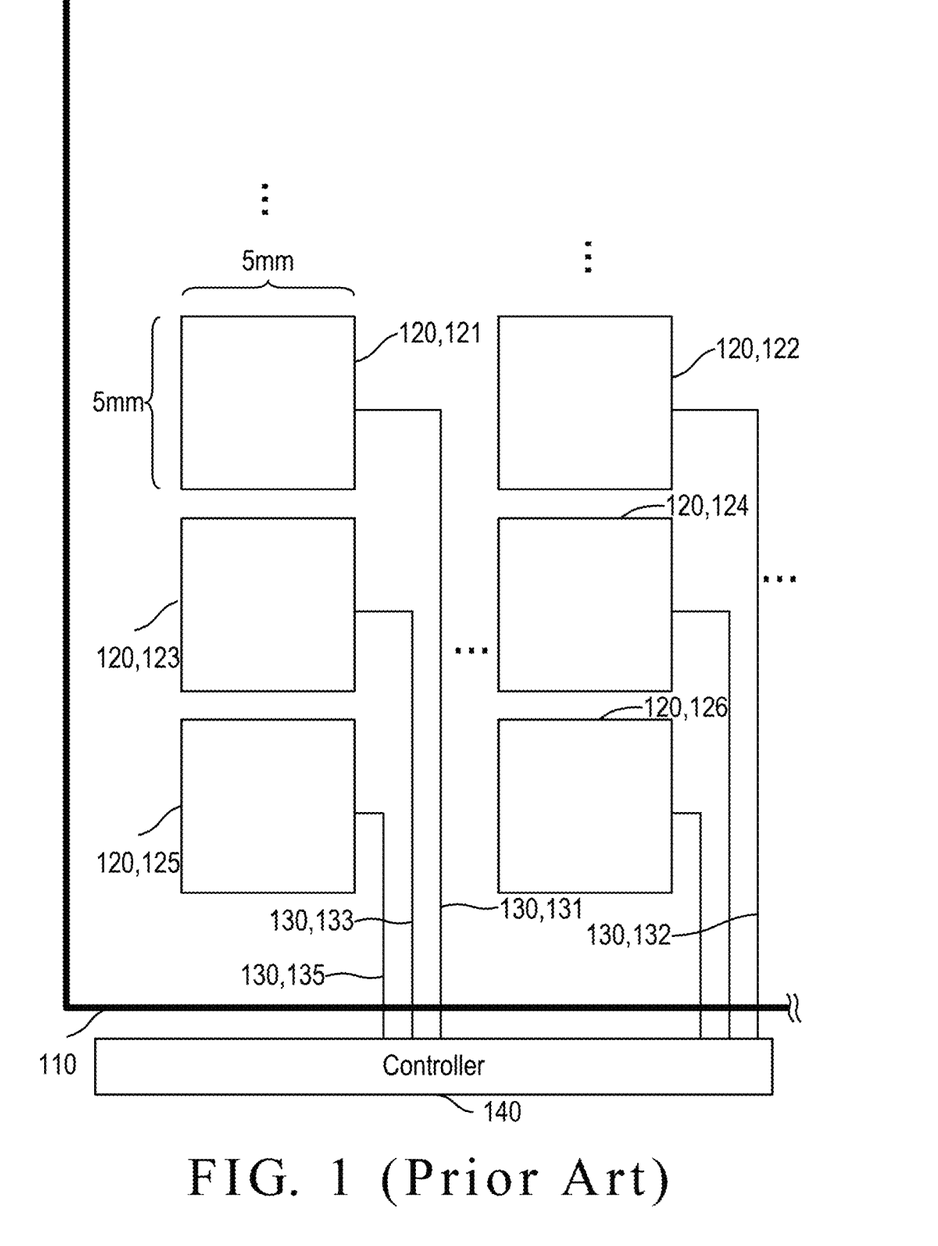
FIG. 1 is a schematic diagram of a typical capacitive sensing.

FIG. 1 is a schematic diagram of a typical capacitive sensing. As shown in FIG. 1, there is a substrate 110 implemented thereon a plurality of sensing electrodes 120. Each sensing electrode 120 is electrically connected to a controller 140 via a corresponding trace 130. When the finger of a user comes into touch with the substrate 110, the controller 140 respectively drives the sensing electrodes 120 to perform a self-capacitance sensing. For obtaining a sensed image of the fingerprint, the controller 140 requires reading sensed signals on the sensing electrodes, respectively. When the controller 14 reads the sensed signal of the sensing electrode 121 from the trace 131, the sensed signal of the sensing electrode 121 is likely to be affected by the sensed signals on the surrounding sensing electrodes 122, 123, as well as the sensed signals on the traces 132, 135. Such a phenomenon becomes more obvious when the size of the sensing electrode 120 is reduced. As a result, the sensing resolution of the fingerprint identification device cannot be increased.

Therefore, it is desirable to provide an improved biometric identification device to mitigate and/or obviate the aforementioned problems.

SUMMARY OF THE INVENTION

The object of the present invention is to provide a biometric identification device having sensing electrodes with multiple connection selections, which can accurately read sensed signals on sensing electrodes and reduce the size of the sensing electrodes so as to increase the sensing resolution.

To achieve the object, the present invention provides a biometric identification device having sensing electrodes with multiple connection selections, which includes: a substrate; a plurality of sensing electrodes disposed on a surface of the substrate; a plurality of data readout selectors each corresponding to one sensing electrode and having a first terminal, a second terminal and a third terminal, wherein the first terminal is connected to the corresponding sensing electrode; a plurality of reference voltage selectors each having a first terminal, a second terminal and a third terminal, each of the sensing electrodes corresponding to at least one reference voltage selector, wherein the first terminal is connected to the corresponding sensing electrode; a plurality of data readout select traces each connected to the second terminal of at least one corresponding data readout selector; a plurality of sensed signal readout lines each connected to the third terminal of the at least one corresponding data readout selector; a plurality of reference voltage select traces each connected to the second terminal of at least one corresponding reference voltage selector; and a control unit connected to the plurality of data readout selectors and the plurality of reference voltage selectors through the plurality of data readout select traces, the plurality of sensed signal readout lines, and the plurality of reference voltage select traces for reading a sensed signal of the sensing electrode corresponding to each data readout selector, wherein the control unit divides the plurality of sensing electrodes into at least one sensing area and at least one non-sensing area by means of the plurality of data readout selectors and the plurality of reference voltage selectors.

Other objects, advantages, and novel features of the invention will become more apparent from the following detailed description when taken in conjunction with the accompanying drawings.

DETAILED DESCRIPTION OF THE PREFERRED EMBODIMENT

Figure 2:
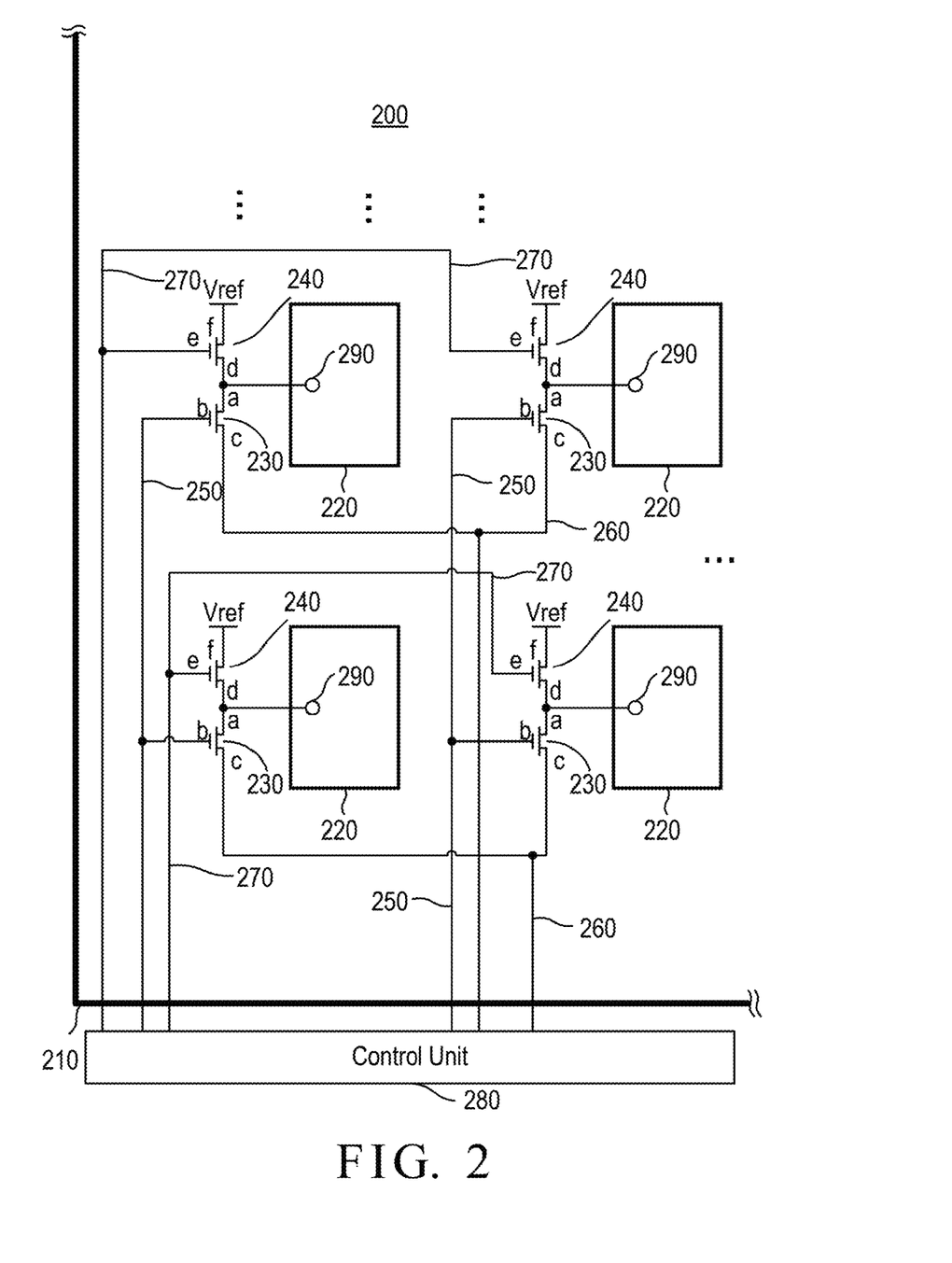
FIG. 2 is a schematic diagram of a biometric identification device having sensing electrodes with multiple connection selections according to a first embodiment of the present invention.

FIG. 2 is a schematic diagram of a biometric identification device 200 having sensing electrodes with multiple connection selections according to a first embodiment of the present invention. The biometric identification device 200 includes a substrate 210, a plurality of sensing electrodes 220, a plurality of data readout selectors 230, a plurality of reference voltage selectors 240, a plurality of data readout select traces 250, a plurality of sensed signal readout lines 260, a plurality of reference voltage select traces 270, and a control unit 280.

The substrate 210 can be a polymer thin film substrate or a glass substrate. The sensing electrodes 220 are disposed on a surface of the substrate 210 in a matrix form. Each of the sensing electrodes 220 can be a polygon, circle, ellipse, rectangle, or square. Each of the sensing electrodes 220 has a width smaller than or equal to 100 μm and a length smaller than or equal to 100 μm.

Each sensing electrode 220 is formed of conductive metal material. The conductive metal material is selected from the group consisting of: chromium, barium, aluminum, silver, copper, titanium, nickel, tantalum, cobalt, tungsten, magnesium, calcium, potassium, lithium, indium, and alloy thereof.

Each of the data readout selectors 230 is corresponding to one sensing electrode 220. Each of the data readout selectors 230 has a first terminal (a), a second terminal (b), and a third terminal (c), wherein the first terminal (a) is connected to the corresponding sensing electrode 220 through a via 290. In addition, each of the data readout selectors 230 is a first thin film transistor (TFT) having a gate serving as the second terminal (b), a source/drain serving as the first terminal (a), and a drain/source serving as the third terminal (c).

Each of the sensing electrodes 220 is corresponding to at least one reference voltage selector 240. In the embodiment of FIG. 2, each sensing electrode 220 is corresponding to one reference voltage selector 240. Each of the reference voltage selectors 240 has a first terminal (d), a second terminal (e), and a third terminal (f), wherein the first terminal (d) is connected to the corresponding sensing electrode. Each reference voltage selector 240 is a second TFT having a gate serving as the second terminal (e), a source/drain serving as the first terminal (d), and a drain/source serving as the third terminal (c).

Each of the data readout select traces 250 is connected to the second terminal (b) of at least one corresponding data readout selector 230. In the embodiment of FIG. 2, each data readout select trace 250 is connected to the second terminals (b) of two data readout selectors 230.

Each of the sensed signal readout lines 260 is connected to the third terminal (c) of the at least one corresponding data readout selector 230. In the embodiment of FIG. 2, each sensed signal readout line 260 is connected to the third terminals (c) of two data readout selectors 230.

Each of the reference voltage select traces 270 is connected to the second terminal (e) of at least one corresponding reference voltage selector 240. In the embodiment of FIG. 2, each reference voltage select trace 270 is connected to the second terminals (e) of two reference voltage selectors 240.

The control unit 280 is connected respectively to the plurality of data readout selectors 230 and the plurality of reference voltage selectors 240 through the plurality of data readout select traces 250, the plurality of sensed signal readout lines 260, and the plurality of reference voltage select traces 270 for reading a sensed signal of the sensing electrode 220 corresponding to each data readout selector 230. By means of the data readout selectors 230 and the reference voltage selectors 240, the control unit 280 divides the sensing electrodes 220 into at least one sensing area and at least one non-sensing area.

As shown in FIG. 2, the third terminal (f) of the reference voltage selector 240 is connected to a reference voltage Vref. In this embodiment, the reference voltage Vref is preferably at 0V. In other embodiments, the third terminals (f) of the reference voltage selectors 240 can be connected to different reference voltages Vref1, Vref2, . . . , and Vrefn, respectively, where n is a natural number and Vrefn is a constant voltage at a specific level or a time-variable alternating voltage signal.

Figure 3:
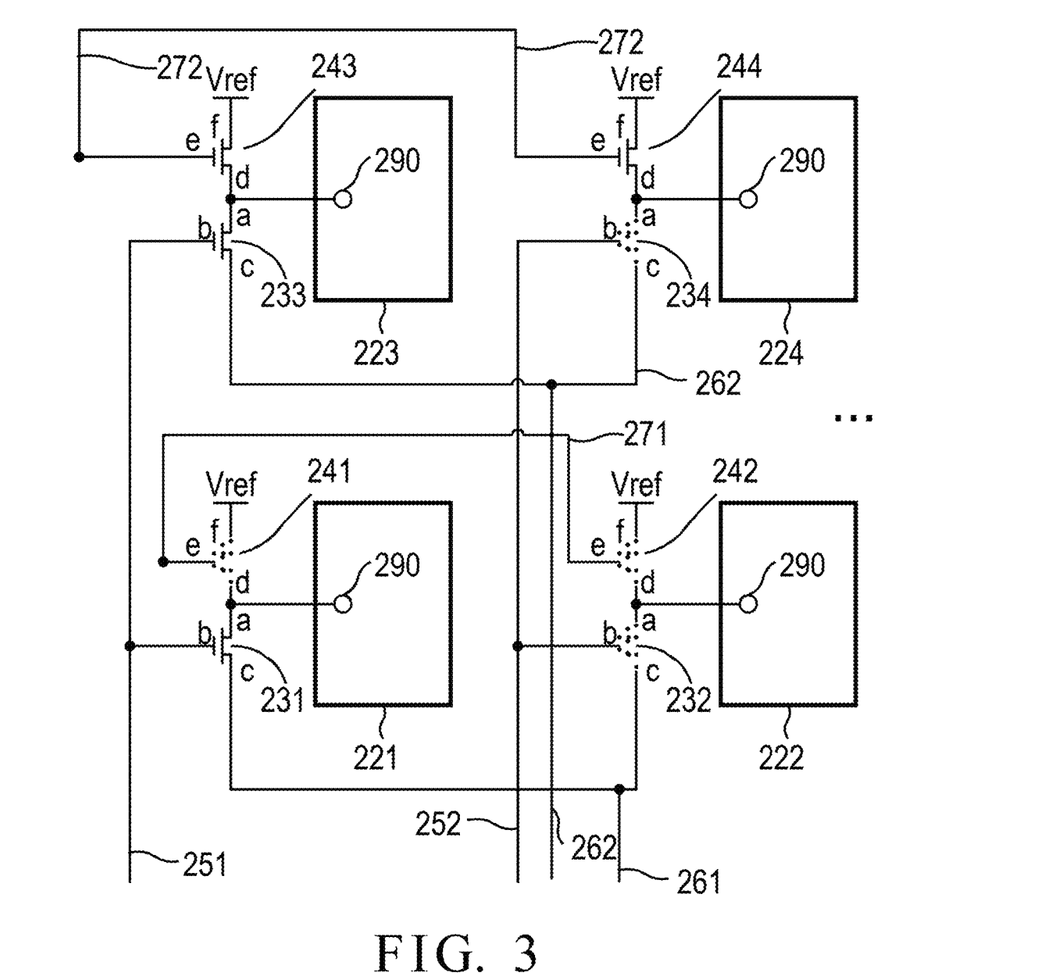
FIG. 3 schematically illustrates an operation of the biometric identification device of FIG. 2.

FIG. 3 schematically illustrates an operation of the biometric identification device 200 of FIG. 2, which demonstrates how to accurately read the sensed signal on the sensing electrode 221. In FIG. 3, there are only four sensing electrodes 221, 222, 223, 224 shown for illustrative purpose only, but the present invention is not limited to it.

When a self-capacitance sensing is performed, the control unit 280 drives the data readout select trace 251 to a high voltage and the data readout select trace 252 to a low voltage so as to turn on the data readout selectors 231, 233 and turn off the data readout selectors 232, 234, and simultaneously drives the reference voltage select trace 271 to the low voltage and the reference voltage select trace 272 to a high voltage so as to turn off the reference voltage selectors 241, 242 and turn on the reference voltage selectors 243, 244.

The control unit 280 can read the sensed signal on the sensing electrode 221 from the sensed signal readout line 261. Since the data readout selector 232 is turned off, the sensed signal on the sensing electrode 222 does not affect the sensed signal on the sensing electrode 221. Meanwhile, the reference voltage selectors 243, 244 are turned on and the reference voltage Vref is at 0V, so that the sensing electrodes 223, 224 are also at 0V and thus the sensed signal on the sensing electrode 221 is not affected. In addition, since the data readout selectors 232, 234 are turned off, the sensed signal readout line 262 does not deliver the sensed signal on the sensing electrodes 223, 224, so that the sensed signal readout line 262 does not affect the sensed signal on the sensing electrode 221 as well. Accordingly, the control unit 280 can accurately read the sensed signal on the sensing electrode 221.

Figure 4:
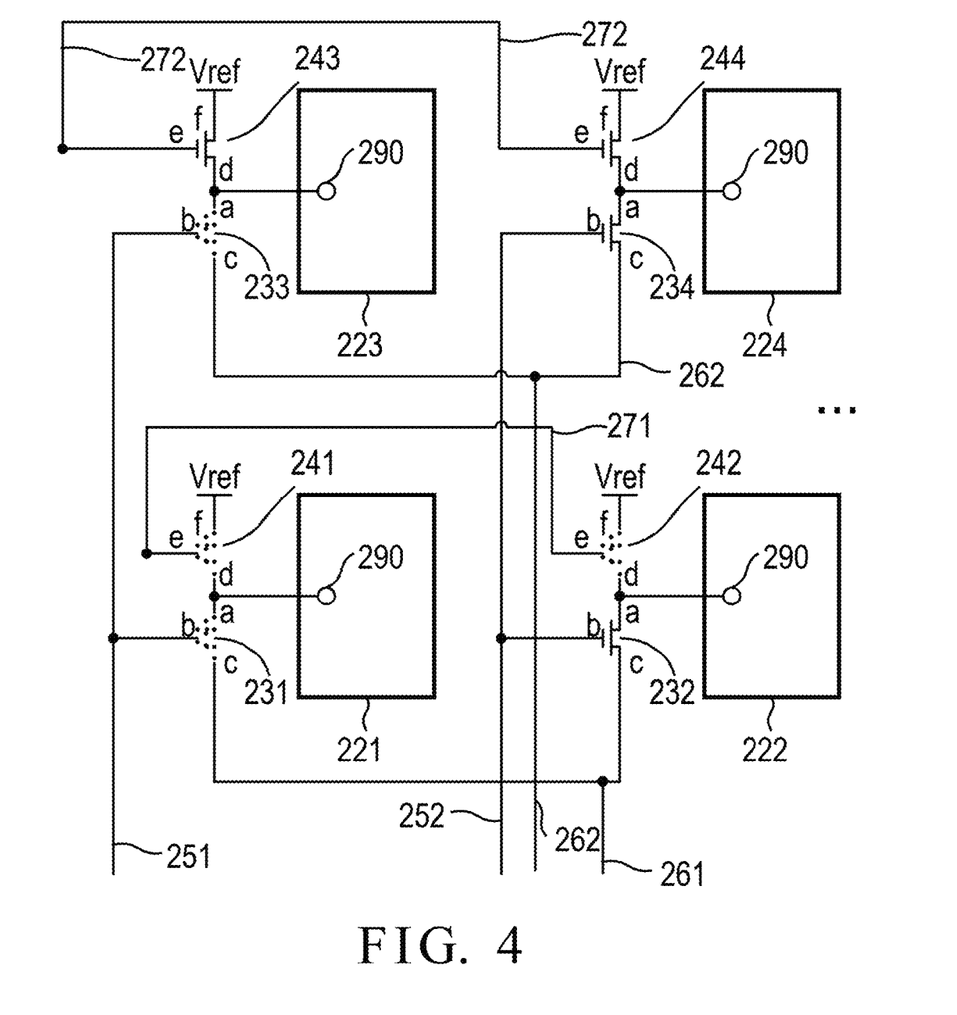
FIG. 4 schematically illustrates another operation of the biometric identification device of FIG. 2.

FIG. 4 schematically illustrates another operation of the biometric identification device 200 of FIG. 2, which demonstrates how to accurately read the sensed signal on the sensing electrode 222. When a self-capacitance sensing is performed, the control unit 280 drives the data readout select trace 252 to a high voltage and the data readout select trace 251 to a low voltage so as to turn on the data readout selectors 232, 234, and turn off the data readout selectors 231, 233, and simultaneously drives the reference voltage select trace 271 to a low voltage and the reference voltage select trace 272 to a high voltage so as to turn off the reference voltage selectors 241, 242 and turn on the reference voltage selectors 243, 244.

The control unit 280 can read the sensed signal on the sensing electrode 222 from the sensed signal readout line 261. Meanwhile, the reference voltage selectors 243, 244 are turned on and the reference voltage Vref is at 0V, so that the sensing electrodes 223, 224 are also at 0V and thus the sensed signal on the sensing electrode 222 is not affected. In addition, since the data readout selectors 231, 233 are turned off, the sensed signal readout line 262 does not deliver the sensed signal on the sensing electrodes 223, 224, so that the sensed signal readout line 262 does not affect the sensed signal on the sensing electrode 222 as well. Accordingly, the control unit 280 can accurately read the sensed signal on the sensing electrode 222.

Figure 5:
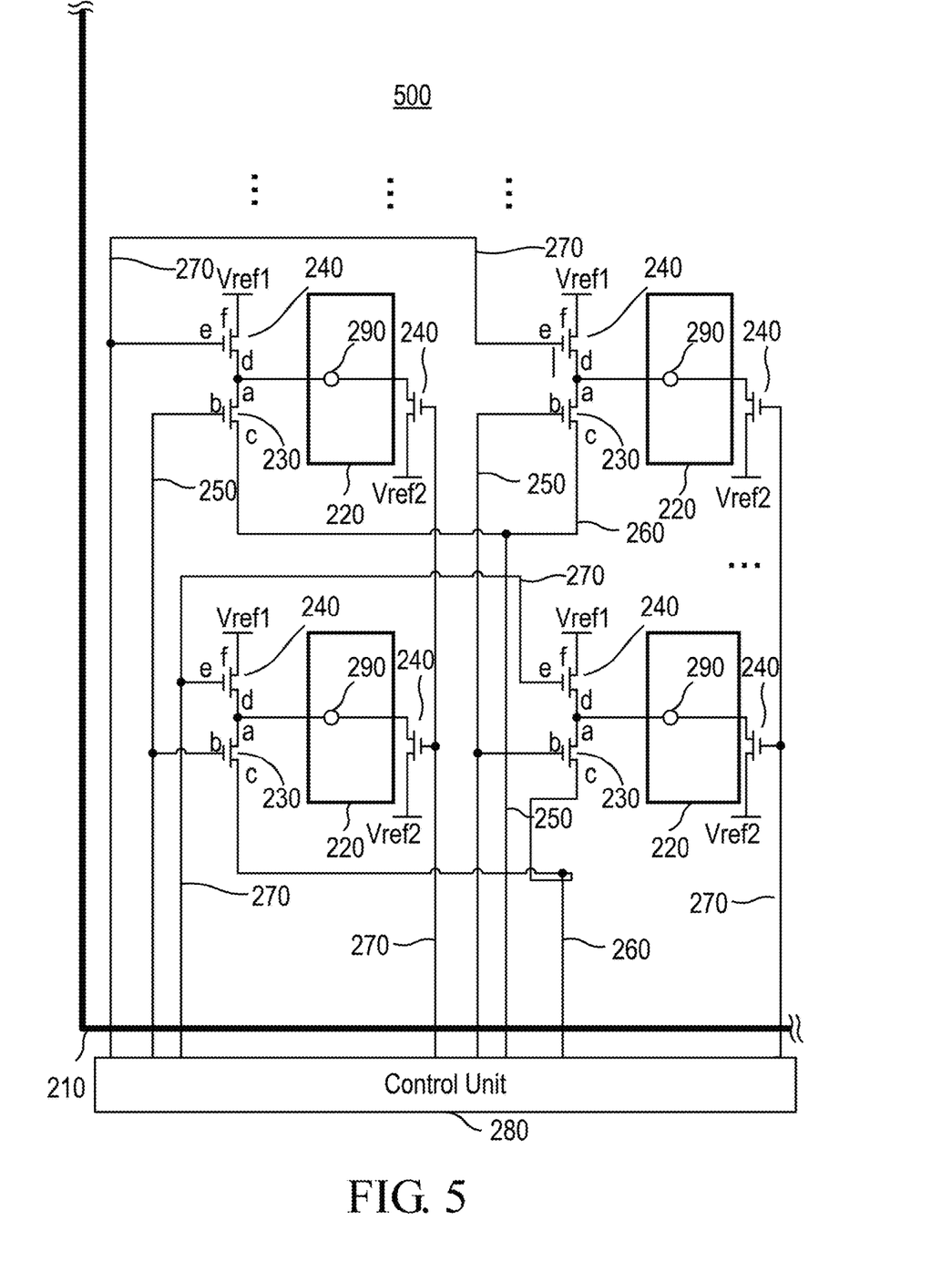
FIG. 5 is a schematic diagram of a biometric identification device having sensing electrodes with multiple connection selections according to a second embodiment of the present invention.

FIG. 5 is a schematic diagram of a biometric identification device 500 having sensing electrodes with multiple connection selections according to a second embodiment of the present invention. This embodiment is similar to the previous embodiment of FIG. 2 except that each of the sensing electrodes 220 is corresponding to two reference voltage selectors 240, which are connected to reference voltages Vref1, Vref2, respectively.

Figure 6:
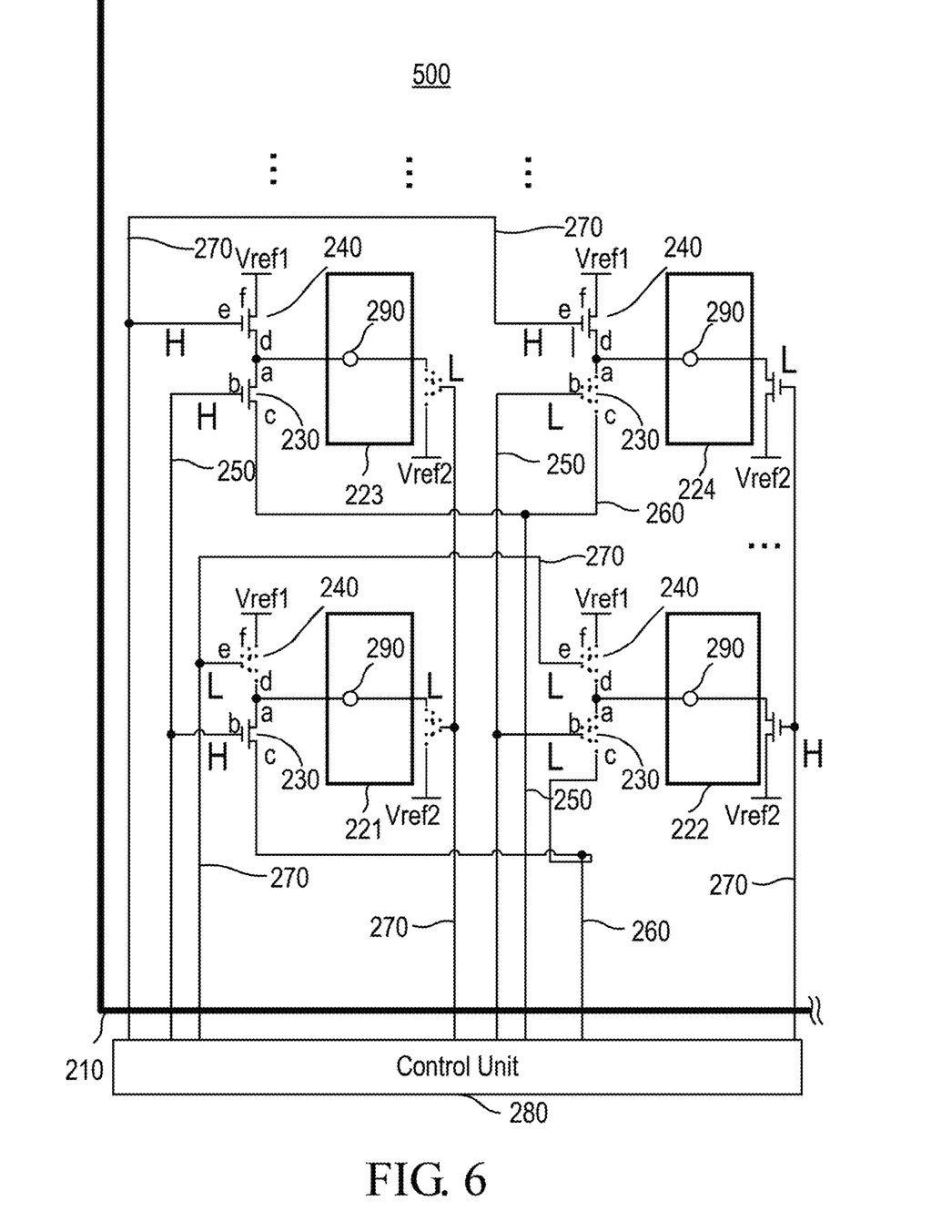
FIG. 6 schematically illustrates an operation of the biometric identification device of FIG. 5.

FIG. 6 schematically illustrates an operation of the biometric identification device of FIG. 5 according to the second embodiment of the present invention. In FIG. 6, the reference voltages Vref1, Vref2 are preferably at 0V. The trace labeled with "H" indicates that the control unit 280 drives the trace at a high voltage, and thus the TFT controlled by the trace is turned on. The trace labeled with "L" indicates that the control unit 280 drives the trace at a low voltage, and thus the TFT controlled by the trace is turned off.

As shown in FIG. 6, the sensing electrodes 223, 224 are connected to the reference voltage Vref1 (0V), and thus they will not affect the sensed signal on the sensing electrode 221. The sensing electrode 222 is connected to the reference voltage Vref2 (0V), and thus it also does not affect the sensed signal on the sensing electrode 221.

Figure 7:
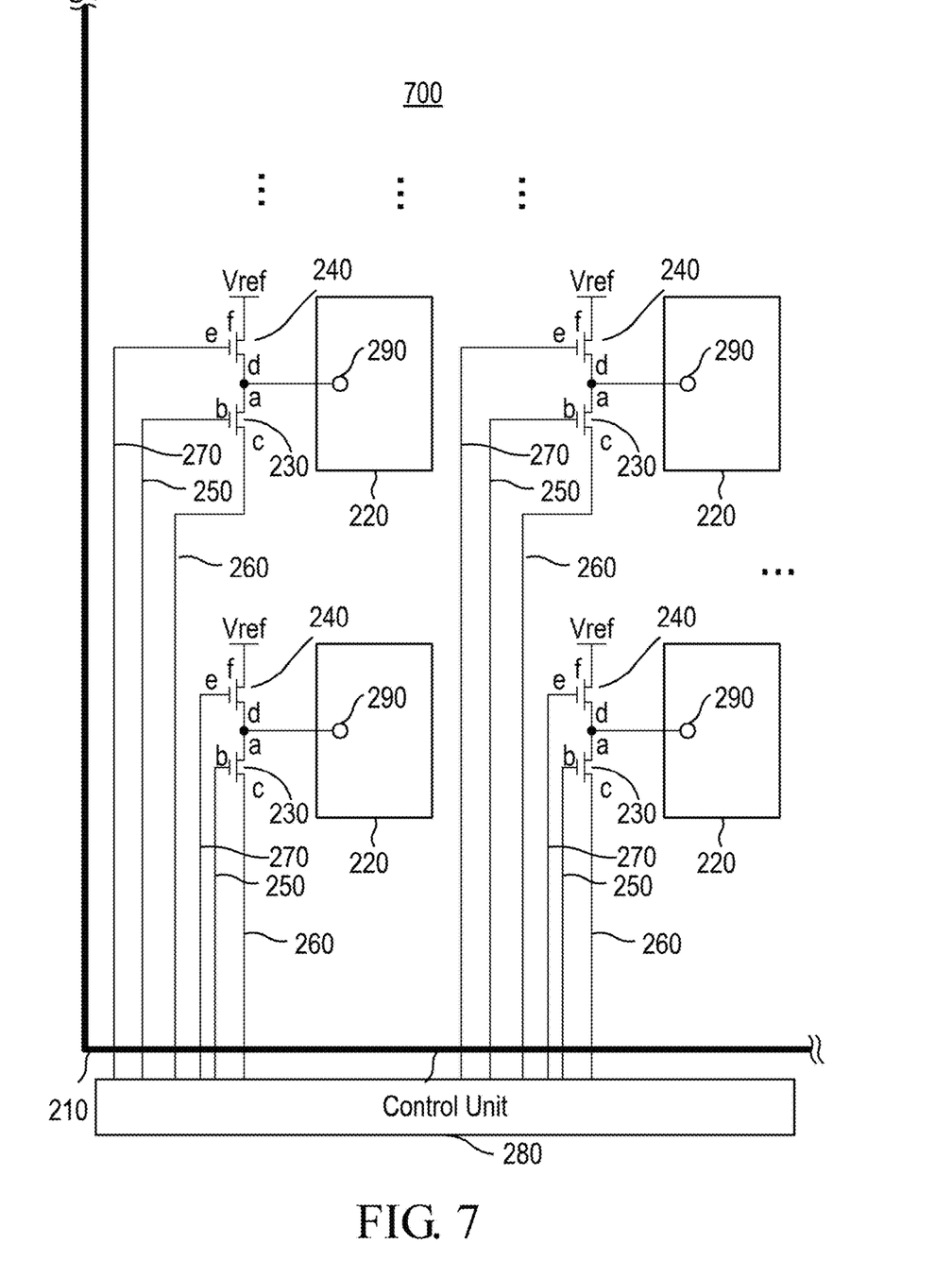
FIG. 7 is a schematic diagram of a biometric identification device having sensing electrodes with multiple connection selections according to a third embodiment of the present invention.

FIG. 7 is a schematic diagram of a biometric identification device 700 having sensing electrodes with multiple connection selections according to a third embodiment of the present invention. In FIG. 7, the plurality of data readout select traces 250, the plurality of sensed signal readout lines 260, and the plurality of reference voltage select traces 270 are respectively connected to the data readout selectors 230 and reference voltage selectors 240.

Figure 8:
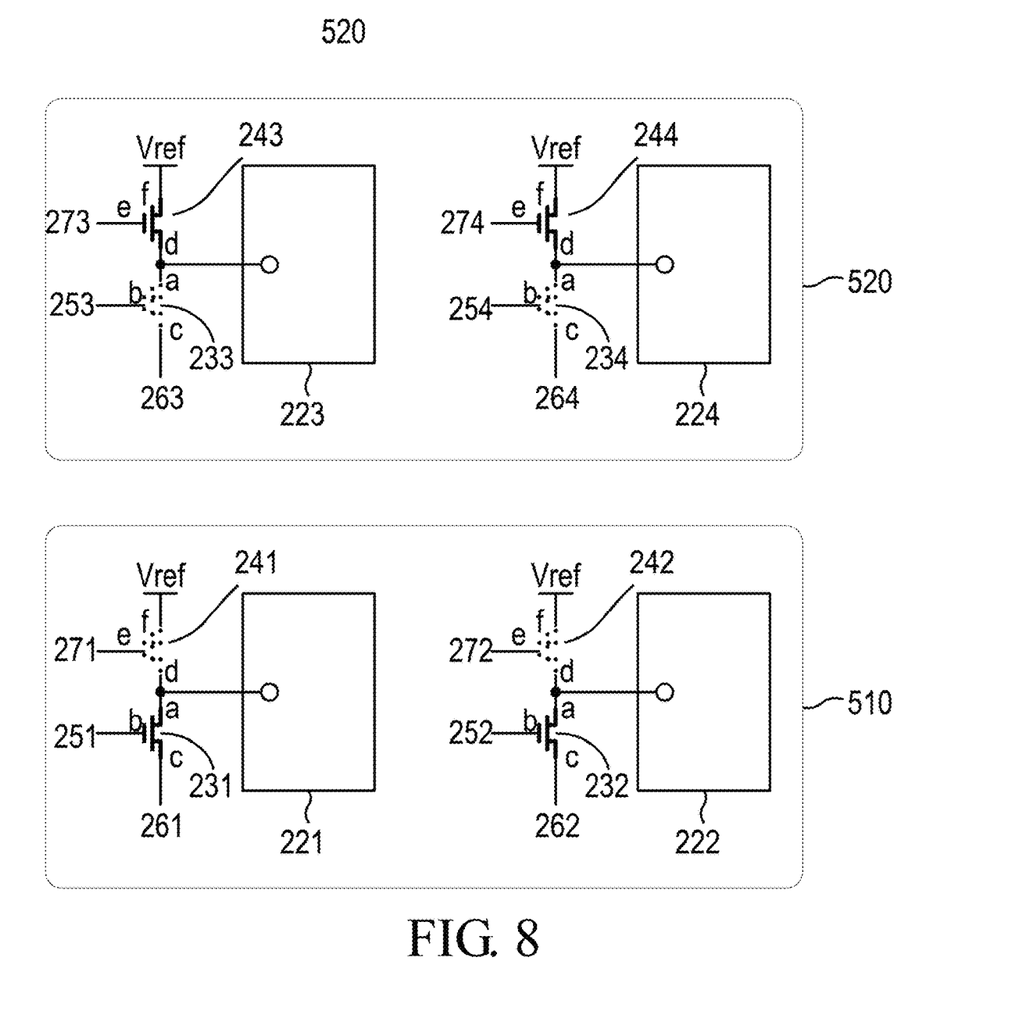
FIG. 8 schematically illustrates an operation of the biometric identification device of FIG. 7.

FIG. 8 schematically illustrates an operation of the biometric identification device of FIG. 7 according to the third embodiment of the invention, which demonstrates how to divide the sensing electrodes 221, 222, 223, 224 into a sensing area 510 and a non-sensing area 520. The detailed signal control can be accomplished by those skilled in the art based on the disclosure of the present invention, and thus a detailed description therefore is deemed unnecessary.

In view of foregoing, it is known that the present invention can avoid the adjacent sensing electrodes from affecting the active sensing electrode. Therefore, the control unit can accurately read the sensed signal on the sensing electrode, so as to increase the sensing accuracy. In addition, the traces also do not affect the sensed signal on the sensing electrode, so that the size of the sensing electrodes can be reduced and the sensing resolution can be increased.

Although the present invention has been explained in relation to its preferred embodiment, it is to be understood that many other possible modifications and variations can be made without departing from the spirit and scope of the invention as hereinafter claimed.

What is claimed is:

1. A biometric identification device having sensing electrodes with multiple connection selections, comprising:
   a substrate;
   a plurality of sensing electrodes disposed on a surface of the substrate;
   a plurality of data readout selectors each corresponding to one sensing electrode and having a first terminal, a second terminal and a third terminal, wherein the first terminal is connected to the corresponding sensing electrode;
   a plurality of reference voltage selectors each having a first terminal, a second terminal and a third terminal, each of the sensing electrodes corresponding to at least one reference voltage selector, wherein the first terminal is connected to the corresponding sensing electrode;
   a plurality of data readout select traces each connected to the second terminal of at least one corresponding data readout selector;
   a plurality of sensed signal readout lines each connected to the third terminal of the at least one corresponding data readout selector;
   corresponding reference voltage selector; and
   a control unit connected to the plurality of data readout selectors and the plurality of reference voltage selectors through the plurality of data readout select traces, the plurality of sensed signal readout lines, and the plurality of reference voltage select traces for reading a sensed signal of the sensing electrode corresponding to each data readout selector,
   wherein the control unit divides the plurality of sensing electrodes into at least one sensing area and at least one non-sensing area by means of the plurality of data readout selectors and the plurality of reference voltage selectors.

2. The biometric identification device as claimed in claim 1, wherein each of the data readout selectors is a first thin film transistor, and each of the reference voltage selectors is a second thin film transistor.

3. The biometric identification device as claimed in claim 2, wherein the first thin film transistor has a gate serving as the second terminal of the data readout selector, a source/drain serving as the first terminal of the data readout selector, and a drain/source serving as the third terminal of the data readout selector.

4. The biometric identification device as claimed in claim 3, wherein the second thin film transistor has a gate serving as the second terminal of the reference voltage selector, a source/drain serving as the first terminal of the reference voltage selector, and a drain/source serving as the third terminal of the reference voltage selector.

5. The biometric identification device as claimed in claim 4, wherein each of the sensing electrodes has a shape of a polygon, circle, ellipse, rectangle, or square.

6. The biometric identification device as claimed in claim 5, wherein each of the sensing electrode has a width smaller than or equal to 100 μm and a length smaller than or equal to 100 μm.

7. The biometric identification device as claimed in claim 6, wherein each of the sensing electrodes is made of conductive metal material.

8. The biometric identification device as claimed in claim 7, wherein the conductive metal material is selected from the group consisting of: chromium, barium, aluminum, silver, copper, titanium, nickel, tantalum, cobalt, tungsten, magnesium, calcium, potassium, lithium, and indium.

9. The biometric identification device as claimed in claim 8, wherein the substrate is a polymer thin film substrate or a glass substrate.

* * * * *